United States Patent [19]

Laxman et al.

[11] Patent Number: 5,744,196
[45] Date of Patent: Apr. 28, 1998

[54] LOW TEMPERATURE DEPOSITION OF SILICON DIOXIDE USING ORGANOSILANES

[75] Inventors: Ravi Kumar Laxman, Encinitas; Arthur Kenneth Hochberg, Solana Beach, both of Calif.

[73] Assignee: Air Products and Chemicals, Inc., Allentown, Pa.

[21] Appl. No.: 678,277

[22] Filed: Jul. 11, 1996

Related U.S. Application Data

[63] Continuation of Ser. No. 368,571, Jan. 4, 1975, abandoned.

[51] Int. Cl.$^6$ ................................................. C23C 16/40
[52] U.S. Cl. .................... 427/255.3; 427/255.2; 427/255.1; 427/255; 427/314
[58] Field of Search ................. 427/255.3, 255.2, 427/255.1, 255, 314

[56] References Cited

U.S. PATENT DOCUMENTS

| | | | |
|---|---|---|---|
| 4,900,591 | 2/1990 | Bennett et al. | 427/255 |
| 4,923,716 | 5/1990 | Brown et al. | 427/249 |
| 4,981,724 | 1/1991 | Hochberg et al. | 427/255.3 |
| 5,190,890 | 3/1993 | Precht et al. | 437/100 |
| 5,204,141 | 4/1993 | Roberts et al. | 427/255.3 |
| 5,455,367 | 10/1995 | Klein et al. | 556/474 |

OTHER PUBLICATIONS

Handbook of Thin Film Technology, Maissell, Leon I. and Glang, Reinhard, editors McGraw Hill Book Company, New York, (1970). No Page Number.

"Silicon Processing for the VLSI Era," Wolf, Stanley, and Tauber, Richard N., editors, Lattice Press, Sunset Beach, California, pp. 182–191, (1986).

A. K. Hochberg and D. A. Roberts, Mat. Res. Soc. Symp. Proc. vol. 282, pp. 569–574, (1993), Material Research Society.

A. K. Hochberg and D. L. O'Meara, J. Electrochem. Soc., vol. 136, pp. 1843–1844, (1989).

Bennet, B. R., et al. Appl. Phys. Lett. 50(4), pp. 197–199, (1987).

Chapple–Sokol, J. D., Gordon, R. G., Thin Solid Films, 171, (1989) pp. 291–305.

Barry Gelernt, Semiconductor International, "Selecting an Organosilicon Source for LPCVD Oxide," Cahners Publishing Co., Mar. 1990. No Page Number.

Primary Examiner—Roy V. King
Attorney, Agent, or Firm—Geoffrey L. Chase

[57] ABSTRACT

The present invention is a process for very low temperature chemical vapor deposition of silicon dioxide, comprising the steps of a) heating a substrate upon which silicon dioxide is to be deposited to a temperature in the range of approximately 150 to 500° C. in a vacuum maintained at a pressure in the range of approximately 50 to 750 mTorr;

b) introducing into said vacuum an organosilane containing feed and an oxygen containing feed, said organosilane containing feed consisting essentially of one or more compounds having the general formula:

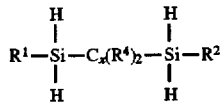

wherein $R^1$ and $R^2$ are independently alkyl, alkenyl, alkynyl, or aryl, having $C_1$ to $C_6$, or $R^1$ and $R^2$ are combined to form an alkyl chain $C_x(R^3)_2$, where $R^3$ is independently H, $C_xH_{2x+1}$, and x=1–6, and $R^4$ is independently H, $C_yH_{2y+1}$ where y=1–6; and c) maintaining said temperature and vacuum thereby causing a thin film of silicon dioxide to deposit on the substrate.

7 Claims, 1 Drawing Sheet

LOW TEMPERATURE DEPOSITION OF SILICON DIOXIDE USING ORGANOSILANES

This is a continuation, of application Ser. No. 08/368.571 filed Jan. 4, 1995 now abandoned.

FIELD OF THE INVENTION

The present invention is directed to a low temperature deposition of silicon dioxide films on various substrates, such as semiconductor materials, using organosilanes, preferably organo bis (secondary silyls).

BACKGROUND OF THE INVENTION

In the fabrication of semiconductor devices, a thin passive layer of a chemically inert dielectric material such as, silicon dioxide ($SiO_2$) is essential. Thin layers of silicon dioxide function as a intermetallic dielectric material or as a passivation layer. Silicon dioxide coatings in the fabrication of semiconductor devices have a variety of applications. Some of these uses are; insulators between polysilicon and metal layers, between metal layers in multilevel metal systems, as getters, as diffusion sources, as diffusion and implantation masks, as capping layers and as passivation layers. See HANDBOOK OF THIN FILM TECHNOLOGY, Maissell, Leon I. and Glang, Reinhard, editors, Mc Graw Hill Book Company, New York, 1970, and SILICON PROCESSING FOR THE VLSI ERA, Wolf, Stanley, and Talbert, Richard N., editors, Lattice Press, Sunset Beach, Calif., 1986.

Deposition of silicon dioxide over large numbers of wafers can be accomplished using many precursors. Barry Gelernt, Semiconductor International March 1990. To date, there are three temperature zones at which thermal CVD silicon dioxide may be deposited. These are: Low temperature deposition, which is approximately <450° C., medium temperature deposition which is at least 450° C., more preferably approximately 650°–750° C. and high temperature deposition which is greater than 750° C., more preferably approximately 900° C. or greater.

There are very few precursors which are known to deposit in the low temperature region.

1) 1,4-disilabutane (containing the group —$SiH_3$) is reported to deposit at temperatures as low as 100° C. One major drawback with 1,4-disilabutane is its safety. It is extremely flammable and due to its very high flammability, safe manufacture of 1,4-disilabutane is found to be difficult. A. K. Hochberg and D. A. Roberts Mat. Res. Soc. Symp. Proc. Vol 282, pp569, 1993 Material Research Society.

2) The LPCVD silane/oxygen process requires deposition temperatures from 350° to 450° C. In a LPCVD process deposition under 350° C. does not occur. Under APCVD conditions silicon dioxide has been reported to deposit below 250° C. using very dilute mixtures for small wafer loads, but the films are of poor quality. The major disadvantage is that silane is a pyrophoric, toxic compressed gas. Bennett, B. R., et al. U.S. Pat. No. 4,900,591. Bennett, B. R et al. Appl. Phys. Lett.,50(4), pp197, 1987.

3) Diethylsilane and other ethylsilanes. A series of homologous ethylsilanes were studied as low temperature silicon dioxide precursors. Diethylsilane gave the best results as a medium temperature silicon dioxide deposition precursor. Diethylsilane pyrolyzes at 260° C., no deposition occurs below 340° C. Abrupt cessation of deposition rate is observed at pressures below 350 mTorr and 340° C. A. K. Hochberg and D. L. O'Meara, J. Electrochem. Soc., Vol 136, pp1843, 1989.

4) Silacyclobutane deposited silicon dioxide as low as 350° C. This precursor is not stable and decomposes to a polymer at room temperature on standing for prolonged lengths of time. Silacyclopentane on the other hand does not deposit silicon dioxide below 360° C.

5) Other precursors which are listed in Table 1., Methyl propylsilane and Di-t-butylsilane deposit silicon dioxide at 480° C. and 350° C. respectively.

6) Dichlorosilane is reported to deposit silicon dioxide at much higher temperatures 550°–900° C. The films are usually contaminated with particulates at lower temperatures. The precursor itself is a corrosive, toxic, pyrophoric compressed gas. SILICON PROCESSING FOR THE VLSI ERA, Volume 1, Wolf, Stanley and Tauber, Richard N., editors, Lattice Press, Sunset Beach, Calif., 1986, pp184; Chapple-Sokol J. D. Gordon R. G. Thin Solid Films 171, 291(1989).

The prior art has attempted to provide precursors which can deposit silicon dioxide at low temperatures below 450° C. under appropriate conditions. Among these different source materials only silane and 1,4 disilabutane deposit silicon dioxide at temperatures below 400° C. However these precursors are extremely hazardous to handle or manufacture in large quantities. Silane is a pyrophoric compressed gas and 1,4 disilabutane is an extremely flammable liquid and difficult to manufacture safely. With silane, rates of deposition and step coverage are poorer as the temperatures are reduced below 350° C. These and other problems in the prior art are overcome by the present invention, as will be set forth in greater detail below.

At higher pressures, depositions occur before reaching the wafers and homogeneous processes occur (powder formation). The major disadvantage is that silane is a pyrophoric, toxic, compressed gas.

As the deposition temperature is reduced below 350° C., there are very few stable and safe precursors. Prior to the present invention, only 1,4-disilabutane (a primary alkyldisilane, containing the group —$SiH_3$) is reported to deposit at temperatures below 350° C. One major drawback with 1,4-disilabutane is its safety. 1,4-disilabutane is highly reactive with oxygen and is extremely flammable. Due to its very high flammability, safe manufacture of 1,4-disilabutane is difficult.

Generally, reactivity of alkylsilanes with oxygen under elevated temperatures decreases in the order of primary ($H_3SiR$)>secondary ($H_2SiR_2$)>tertiary ($HSiR_3$)>quarternary ($SiR_4$).

A large variety of "thin films" are used in the fabrication of Very Large Scale Integration (VLSI) devices. These deposited thin films can be of metals, semiconductors, or insulators. The films may be thermally grown or deposited from the vapor phase using low pressure chemical vapor deposition (LPCVD, see below).

In VLSI fabrication a large set of rigorous chemical, structural, process and electrical requirements should be satisfied. Purity of the film, thickness, uniformity and deposition rates are some of the strictly controlled parameters to facilitate fabrication of submicron features in a device. It is a major advantage in the fabrication and performance of the device if the deposition process can be carried out at temperatures lower than 350° C. Silicon source materials for depositing silicon dioxide under LPCVD conditions at these temperatures are limited to silane and diethylsilane. A safe, reliable low temperature silicon dioxide source material has applications in other technologies such as flat panel display devices or compound semiconductor device fabrication.

BRIEF SUMMARY OF THE INVENTION

The present invention is a process for low temperature chemical vapor deposition of silicon dioxide, comprising the steps of:

a) heating a substrate upon which silicon dioxide is to be deposited to a temperature in the range of approximately 150° to 500° C. in a vacuum maintained at a pressure in the range of approximately 50 to 750 mTorr;

b) introducing into the vacuum a organosilane containing feed and an oxygen containing feed, the organosilane containing feed consisting essentially of one or more compounds having the general formula:

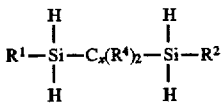

wherein $R^1$ and $R^2$ are independently H, alkyl, alkenyl, alkynyl, or aryl, having $C_1$ to $C_6$, but only one of $R^1$ and $R^2$ can be H, or $R^1$ and $R^2$ can be combined to form an alkyl chain $C_x(R^3)_2$, where $R^3$ is independently H, $C_xH_{2x+1}$, and x=1–6, and $R^4$ is independently H, $C_yH_{2y+1}$ where y=1–6; and c) maintaining the temperature and vacuum thereby causing a thin film of silicon dioxide to deposit on the substrate.

Preferably, the oxygen containing feed is selected from the group consisting of oxygen gas, $N_2O$, $O_3$ and mixtures thereof.

Preferably, the oxygen containing feed to organosilane containing feed ratio is between 0.5:1 and 10:1.

Preferably, the substrate is a silicon wafer.

Preferably, the organosilane is 1,2 bis(methylsilyl)ethane.

Preferably, the organosilane is 1-methylsilyl, 2-silyl ethane.

Preferably, $R^1$ and $R^2$ are independently alkyl, alkenyl, alkynyl, or aryl, having $C_1$ to $C_6$, or $R^1$ and $R^2$ can be combined to form an alkyl chain $C_x(R^3)_2$, where $R^3$ is independently H, $C_xH_{2x+1}$, and x=1–6.

Preferably the present invention is a process for low temperature chemical vapor deposition of silicon dioxide, comprising the steps of:

a) heating a substrate upon which silicon dioxide is to be deposited to a temperature in the range of approximately 150° to 500° C. in a vacuum maintained at a pressure in the range of approximately 50 to 750 mTorr;

b) introducing into the vacuum a 1,2 bis(methylsilyl) ethane containing feed and an oxygen containing feed; and c) maintaining the temperature and vacuum thereby causing a thin film of silicon dioxide to deposit on the substrate.

DETAILED DESCRIPTION OF THE INVENTION

Figure 1:
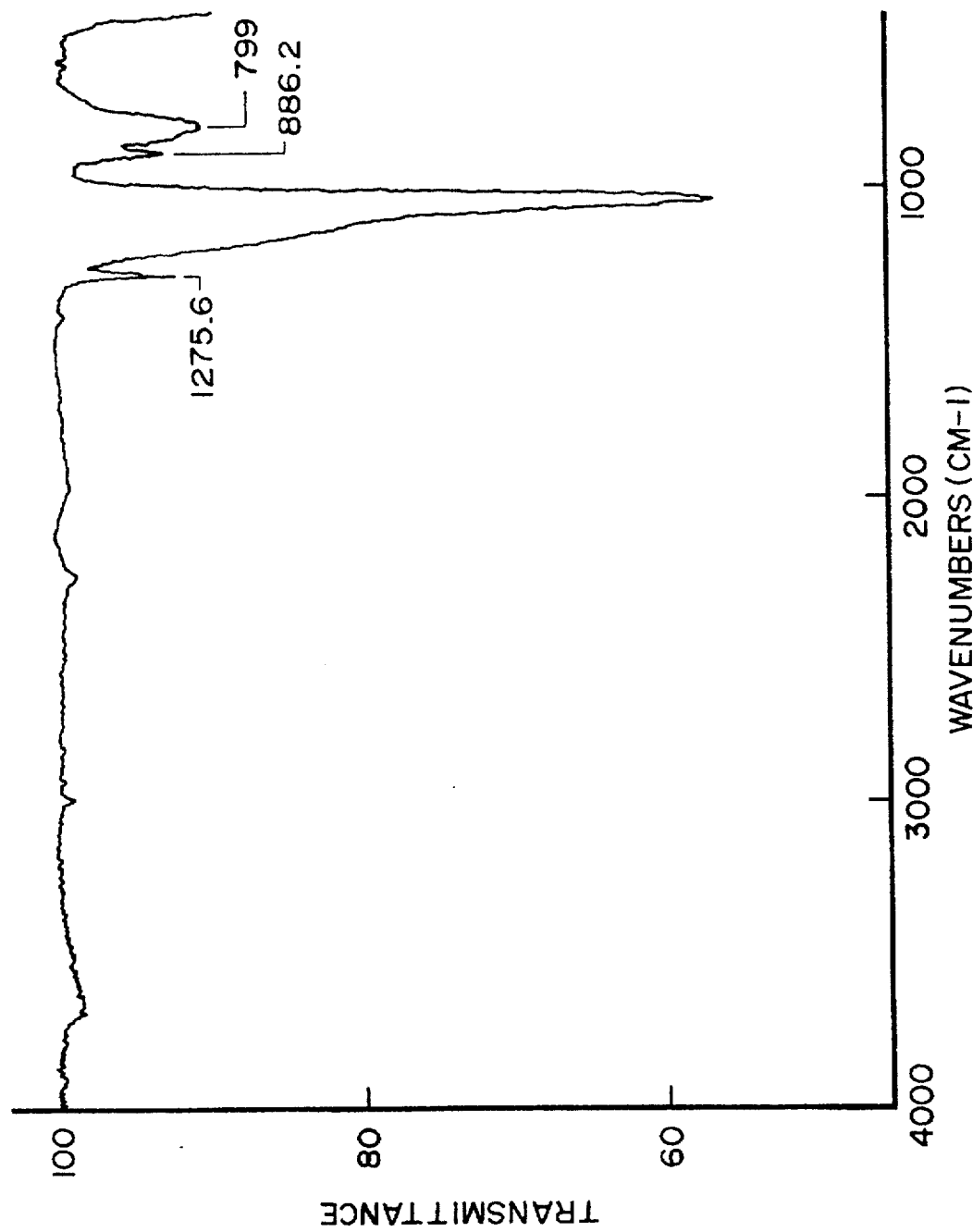
FIG. 1 is an FT-IR spectrum of a typical film of $SiO_2$ produced by the present invention's process using 1,2 bis (methylsilyl)ethane in which Transmittance is graphed against Wavenumbers (cm-1).

The present invention describes deposition of silicon dioxide at an unusually low temperature using organosilanes, such as organo bis (secondary silyls). These precursors are highly volatile, thermally stable and less hazardous than silane which is typically used for silicon dioxide deposition.

Economically, the largest industrial application of this invention is in the manufacture of integrated circuits in which silicon dioxide is deposited on a substrate comprising silicon or another layer in the composite construction of an integrated circuit; however, this invention is applicable to deposition of silicon dioxide on other substrates in the temperature range of 150° to 500° C., particularly using low pressure chemical vapor deposition.

Low pressure chemical vapor deposition processes (LPCVD) involve chemical reactions that are allowed to take place in the pressure range of 150 mtorr to 2 torr. Chemical Vapor Deposition (CVD) processes can be described in the following sequence of steps at a given temperature, pressure and ratio of the reactants:

1) Reactants are introduced into the reaction chamber and may be diluted with inert gases, if needed.
2) The reactants are allowed to diffuse to the substrate.
3) The reactants are adsorbed on the substrate and the adsorbed molecules undergo migration.
4) Chemical reactions occur on the surface and the gaseous byproducts of the reaction are desorbed leaving behind the deposited film.

The reactions are initiated by several methods; e.g., thermal or photons. Thermal energy is used in the LPCVD process, which occurs in a special reactor.

Horizontal and vertical tube hot wall reactors are the most widely used for LPCVD in VLSI manufacturing. They are employed for depositing poly-Si, silicon nitride and undoped and doped silicon dioxide films. These reactors are used extensively because they are economical, have high throughputs, the deposited films are uniform and can accommodate large diameter wafers (6" and 8"). Their main disadvantages are susceptibility to particulate contamination and low deposition rates.

The vacuum system consists of a rotary vane pump/roots blower combination and various cold traps. The reactor pressure is controlled by a capacitance manometer feedback to a throttle valve controller. Reactor loading consists of eighty 100 mm diameter silicon wafers at 9 mm spacing in standard diffusion boats. The boats are positioned on a sled, so that the wafers centers are slightly above the center of the reaction tube. This produces a uniform conductance around the wafer peripheries by compensating for conductance restrictions caused by the boats and the sled. The temperature uniformity across the wafer load for the data presented is ±1° C. as measured by an internal multi-junction thermocouple. Deposition uniformity down the wafer load is improved by a temperature ramp.

The deposition experiments of the present invention were carried out in a horizontal tube reactor, but the deposition with these precursors will occur even in a vertical tube reactor. The precursor was fed through an open injector to the first wafer position. Oxygen was also fed from the door of the furnace separately.

The secondary organosilane compounds of the present invention possess low flammability and low deposition temperature characteristics for silicon dioxide film formation. This compares favorably to 1,4-disilabutane, which is a primary alkyldisilane. In order to reduce the flammability of 1,4-disilabutane, but to retain the low temperature deposition properties of the 1,4-disilabutane, several derivatives of 1,4-disilabutane were synthesized and investigated, two of the alkyl derivatives are listed below.

I. $CH_3SiH_2CH_2CH_2SiH_3$

II. $(CH_3)_2SiHCH_2CH_2SiH_3$ 

In addition to these compounds where there is at least one primary silane (—$SiH_3$), we have also investigated a series of secondary monosilanes (containing the group —$SiH_2$) such as diethylsilane, di (t-butyl)silane, methylpropylsilane, silacyclobutane, silacyclopentane and dichlorosilane.

Although these compounds showed promise in depositing at moderately low temperatures, compound I was still highly flammable. Compound II and the secondary monosilanes needed higher deposition temperatures. Deposition temperatures for the monosilanes are listed in Table 1.

We have discovered that 1,2 bis(methylsilyl)ethane, $CH_3SiH_2CH_2CH_2SiH_2CH_3$, a class of organo bis (secondary silyls) has the property to deposit silicon dioxide at very low temperatures. Our deposition results at 150° C. are very surprising because other analogous secondary monosilane precursors such as diethylsilane, di (t-butyl)silane, methylpropylsilane, silacyclobutane, silacyclopentane and dichlorosilane do not deposit at such low temperatures. Although not wishing to be held to any particular theory, the low deposition temperature of the present invention is apparently due to the presence of two silicon atoms in the organosilane which are in close proximity.

Among secondary monosilane precursors, diethylsilane has been most extensively studied. Diethylsilane pyrolizes at 260° C., no deposition occurs below 340° C.[5]. On the other hand, abrupt cessation of deposition rate is observed at pressures below 350 mTorr and 340° C.

When we substituted 1,2 bis(methylsilyl)ethane for diethylsilane, deposition of silicon dioxide was achieved even below 340° C. High deposition rates were obtained at pressures below 350 mTorr and deposition temperatures as low as 150° C.

When compared to other analogous secondary monosilanes, the temperature of deposition using the organo bis (secondary silyls) of the present invention is much lower. High quality films over large numbers of wafers may be obtained under the conditions described in the experiments below. A comparison of deposition temperatures for a variety of secondary monosilanes and 1,2 bis (methylsilyl) ethane (an organo bis (secondary silyl)) are given in Table 1.

TABLE 1

| Precursor | Deposition temperature (°C.) |
| --- | --- |
| Dichlorosilane | 550 |
| Methyl propylsilane | 480 |
| Di-t-butylsilane | 350 |
| Diethylsilane | 340 |
| 1,1 Dimethyl 1,4 disilabutane | 240 |
| Silacyclopentane | 360 |
| Silacyclobutane | 350 |
| 1,2 bis(methylsilyl)ethane | 150 |

The organosilanes of the present invention comprise one or more compounds having the general formula:

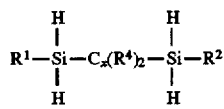

wherein $R^1$ and $R^2$ are independently H, alkyl, alkenyl, alkynyl, or aryl, having $C_1$ to $C_6$, but only one of $R^1$ and $R^2$ can be H, or $R^1$ and $R^2$ can be combined to form an alkyl chain $C_x(R^3)_2$, where $R^3$ is independently H, $C_xH_{2x+1}$, and x=1–6, and $R^4$ is independently H, $C_yH_{2y+1}$ where y=1–6.

Preferably, the organosilanes have only secondary silanes where $R^1$ and $R^2$ are independently alkyl, alkenyl, alkynyl, or aryl, having $C_1$ to $C_6$, or $R^1$ and $R^2$ can be combined to form an alkyl chain $C_x(R^3)_2$, where $R^3$ is independently H, $C_xH_{2x+1}$, and x=1–6. Other organosilanes of the organo bis (secondary silyls) other than 1,2 bis(methylsilyl)ethane are contemplated by the present invention. Such compounds include 1,2 bis(ethylsilyl)ethane, 1,2 bis(propylsilyl)ethane, 1,3 bis(methylsilyl)propane, 1,3 bis(ethylsilyl)propane, and 1,3 bis(propylsilyl)propane. Cyclic organo bis (secondary silyls) are also contemplated, such as 1,4 silacyclohexane. Other organosilanes having at least one secondary silane are also contemplated, such as; 1-methylsilyl, 2-silyl ethane, 1-ethylsilyl, 2-silyl ethane, 1-propylsilyl, 2-silyl ethane, 1-methylsilyl, 3-silyl propane, 1-ethylsilyl, 3-silyl propane, 1-methylsilyl, 4-silyl butane.

The secondary organosilanes of the present invention and oxygen are allowed to react in the reactor tube at an elevated temperature. Reaction may occur either on the surface or very close to the wafer surface to deposit a thin silicon dioxide film. If the reaction occurs in the gas phase (a homogeneous reaction) then clusters of silicon dioxide are formed. When the reaction occurs close to the wafer surface then the resulting films are of good quality. Thus, one important requirement for CVD application is the degree to which heterogeneous reactions are favored over gas phase reactions. The CVD process can be grouped into a) gas-phase process and b) a surface process. The gas phase phenomenon is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas and concentration gradient across the boundary layer. Several surface processes can be important when the gases reach the hot surface, but the surface reaction, in general, can be modeled by a thermally activated phenomenon which proceeds at a rate which is a function of the frequency factor, the activation energy, and the temperature. The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport. This is referred to as a mass-transport limited deposition process. At lower temperatures, the surface reaction rate is reduced, and eventually the concentration of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes, the temperature at which the deposition condition moves from one of these growth regimes to the other is dependent on the activation energy of the reaction, and the gas flow conditions in the reactor. Thus, it is difficult to extrapolate process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This, in turn, implies that a constant temperature must exist everywhere on all wafer surfaces. On the other hand, under such conditions, the rate at which reactants reach the surface is not important, since their concentration does not limit the growth rate. Thus, it is not as critical that a reactor be designed to supply an equal flux of reactants to all locations of a wafer surface. It will be seen that in low-pressure CVD LPCVD reactors, wafers can be stacked vertically and at very close spacing because such systems operate in a reaction rate limited mode. The reason for this is as follows: Under the low pressure of an LPCVD reactor at ~1 torr, the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and by-products away from the substrate surface, and the rate-limiting step is thus the surface reaction.

The present invention is a method of depositing substantially pure silicon dioxide films on silicon wafers by using secondary organosilane precursors, such as organo bis secondary silyls. The secondary organosilane sources have at least one secondary silane and preferably have two secondary silanes. These secondary silanes are non-pyrophoric, volatile liquids, which are safer to handle than silane. The deposition process is carried out at approximately 150 mtorr–750 mtorr in the temperature range of approximately 150°0 C. to 500° C. using vapors from the secondary organodisilane and oxygen. Optionally an inert gas diluent, such as nitrogen or argon, is used to dilute and control the rate of reaction. The molar feed ratio of the secondary organodisilane to oxygen is within the range of 0.5:1 to 0.5:50. Their use in chemical vapor deposition of silicon oxide layers on semiconductor substrates is comparable to the utilization of the primary organodisilanes of U.S. Pat. No. 5,204,141, which is hereby incorporated by reference herein in its entirety.

EXAMPLE 1

The process involves reaction of 1,2 bis (methylsilyl) ethane with oxygen under LPCVD conditions. The precursor and oxygen are introduced into the heated reactor (150° to 500° C.) via injectors placed at the door. The reactants are flowed over wafers into the evacuated chamber. The oxygen to silicon source was varied from 0.5:1 to 4:1 in different runs of the experiment. A continuous film of silicon dioxide is deposited upon the surface of a silicon wafer. These films are suitable for integrated circuit manufacture. A typical run was carried out in a 150 mm hot wall LPCVD horizontal tube reactor, although the apparatus configuration is not critical. The process involves loading the quartz reactor with 75 to 100 silicon wafers, evacuating the system and then letting the wafers come to a desired temperature at which the deposition will be carried out. The energy required for this reaction can be supplied by either a plasma or simple resistive heating. However, simple, resistive heating is advantageous because the equipment is less expensive than that required for plasma type reactions and avoids radiative film damage often associated with plasma reactors.

The films are characterized by infrared spectroscopy and refractive index. An FT-IR spectrum of a typical film is shown in FIG. 1. The spectrum is consistent with silicon dioxide films deposited from other known oxide precursors e.g. diethylsilane. There are no strong absorptions in the Si-H stretching region or in the 3200 cm$^{-1}$ region where C-H stretching are observed. Refractive indices for these films were measured by ellipsometry at 632.4 nm. A mean value of 1.46 was obtained for films.

The primary industrial application of this invention is in the manufacture of semiconductor devices; however, the invention is applicable to any thin film deposition of SiO$_2$ on substrates which are capable of being heated to 150° to 500° C. The present invention has been set forth with regard to one or more specific embodiments, however the scope of the invention should be ascertained from the claims which follow.

We claim:

1. A process for low temperature chemical vapor deposition of silicon dioxide, comprising the steps of a) heating a substrate upon which the silicon dioxide is to be deposited to a temperature in the range of approximately 150° to 500° C. in a vacuum maintained at a pressure in the range of approximately 50 to 750 mTorr;

b) introducing into said vacuum an organosilane containing feed and an oxygen containing feed, said organosilane containing feed consisting essentially of one or more compounds having the general formula:

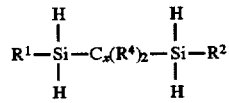

wherein R$^1$ and R$^2$ are independently alkyl, alkenyl, alkynyl, or aryl, having C$_1$ to C$_6$, or R$^1$ and R$^2$ are combined to form an alkyl chain C$_x$(R$^3$)$_2$, where R$^3$ is independently H, C$_x$H$_{2x+1}$, and x=1–6, and R$^4$ is independently H, C$_y$H$_{2y+1}$ where y=1–6; and c) maintaining said temperature and vacuum thereby causing a thin film of the silicon dioxide to deposit on the substrate.

2. A process according to claim 1 wherein said oxygen containing feed is selected from the group consisting of oxygen gas, N$_2$O, O$_3$ and mixtures thereof.

3. A process according to claim 1 wherein said oxygen containing feed to said organosilane containing feed ratio is between 0.5:1 and 10:1.

4. A process according to claim 1 wherein said substrate is a silicon wafer.

5. A process according to claim 1 wherein said organosilane is 1,2 bis(methylsilyl)ethane.

6. A process according to claim 1 wherein said organosilane is 1-methylsilyl, 2-silyl ethane.

7. A process for low temperature chemical vapor deposition of silicon dioxide, comprising the steps of:

a) heating a substrate upon which the silicon dioxide is to be deposited to a temperature in the range of approximately 150° to 500° C. in a vacuum maintained at a pressure in the range of approximately 50 to 750 mTorr;

b) introducing into the vacuum a 1,2 bis(methylsilyl) ethane containing feed and an oxygen containing feed; and c) maintaining the temperature and vacuum thereby causing a thin film of the silicon dioxide to deposit on the substrate.

* * * * *